(12) United States Patent
Halbert et al.

(10) Patent No.: US 7,024,518 B2
(45) Date of Patent: Apr. 4, 2006

(54) DUAL-PORT BUFFER-TO-MEMORY INTERFACE

(75) Inventors: John B. Halbert, Beaverton, OR (US); James M. Dodd, Shingle Springs, CA (US); Chung Lam, Redwood City, CA (US); Randy M. Bonella, Portland, OR (US); Thomas J. Holman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 10/100,312

(22) Filed: Mar. 13, 2002

(65) Prior Publication Data

US 2002/0112119 A1 Aug. 15, 2002

Related U.S. Application Data

(63) Continuation-in-part of application No. 09/678,751, filed on Oct. 3, 2000, now Pat. No. 6,742,098, and a continuation-in-part of application No. 09/023,170, filed on Feb. 13, 1998.

(51) Int. Cl.
*G06F 12/00* (2006.01)

(52) U.S. Cl. .......................... 711/115; 711/101; 711/167

(58) Field of Classification Search .................... 711/5, 711/101, 115, 165, 167, 171–172; 710/33, 710/307; 365/230.05; 714/5
See application file for complete search history.

(56) References Cited

U.S. PATENT DOCUMENTS

| | | |
|---|---|---|
| 4,045,781 A | 8/1977 | Levy et al. |
| 4,675,516 A | 6/1987 | Guion |
| 4,905,182 A | 2/1990 | Fitch et al. |
| 4,910,393 A | 3/1990 | Gercekci et al. |
| 5,036,493 A | 7/1991 | Nielsen |
| 5,228,132 A | 7/1993 | Neal et al. |
| 5,257,233 A | 10/1993 | Schaefer |
| 5,319,591 A | 6/1994 | Takeda et al. |
| 5,357,621 A | 10/1994 | Cox |
| 5,408,633 A | 4/1995 | Katsumura et al. |
| 5,448,710 A | 9/1995 | Liu |
| 5,497,418 A | 3/1996 | Kudelski |

(Continued)

OTHER PUBLICATIONS

Bursky, Dave, ed. *Memory Systems Desing and Applications*, Hayden Book Company, 1980, pp. 213-220.

(Continued)

*Primary Examiner*—Pierre M. Vital
(74) *Attorney, Agent, or Firm*—Marger Johnson & McCollom, PC (57) ABSTRACT

Methods and apparatus for a memory system using a new memory module architecture are disclosed. In one embodiment, the memory module has two ranks of memory devices, each rank connected to a corresponding one of two 64-bit-wide data registers. The data registers connect to two 64-bit-wide ports of a 128:64 multiplexer/demultiplexer, and a 64-bit-wide data buffer connects to the opposite port of the multiplexer/demultiplexer. A controller synchronizes the operation of the data registers, the multiplexer/demultiplexer, and the data buffer.

In an operating environment, the data buffer connects to a memory bus. When a data access is performed, both ranks exchange data signaling with their corresponding data registers during a single data access. At the buffer, the memory bus data transfer occurs in two consecutive clock cycles, one cycle for each rank. This allows the memory bus transfer rate to double for the same memory bus width and memory device speed.

24 Claims, 10 Drawing Sheets

U.S. PATENT DOCUMENTS

| | | | |
|---|---|---|---|
| 5,655,113 A * | 8/1997 | Leung et al. | 713/401 |
| 5,663,901 A | 9/1997 | Wallace et al. | |
| 5,790,447 A | 8/1998 | Laudon et al. | |
| 5,815,646 A * | 9/1998 | Purcell et al. | 345/502 |
| 5,825,424 A * | 10/1998 | Canfield et al. | 375/240.15 |
| 5,883,839 A | 3/1999 | Tosaka et al. | |
| 5,887,198 A | 3/1999 | Houlberg et al. | |
| 5,935,232 A | 8/1999 | Lambrecht et al. | |
| 6,011,741 A | 1/2000 | Wallace et al. | |
| 6,034,878 A * | 3/2000 | Osaka et al. | 365/52 |
| 6,141,739 A * | 10/2000 | Provence et al. | 711/211 |
| 6,189,073 B1 * | 2/2001 | Pawlowski | 711/120 |
| 6,272,583 B1 * | 8/2001 | Sakugawa et al. | 710/307 |
| 6,345,321 B1 | 2/2002 | Litaize et al. | |
| 6,480,947 B1 * | 11/2002 | Hasegawa et al. | 711/167 |
| 6,502,161 B1 | 12/2002 | Perego et al. | |
| 6,530,033 B1 * | 3/2003 | Raynham et al. | 714/5 |
| 6,742,098 B1 * | 5/2004 | Halbert et al. | 711/172 |

OTHER PUBLICATIONS

Intel Corporation, International Application No. PCT/US98/25181, International Filing Date: Nov. 23, 1998.

\* cited by examiner

DUAL-PORT BUFFER-TO-MEMORY INTERFACE

This present invention is a continuation-in-part of prior applications Ser. No. 09/678,751, filed Oct. 3, 2000, entitled DUAL PORT BUFFER TO MEMORY INTERFACE by John B. Halbert, James M. Dodd, Chung Lam and Randy M. Bonella; and Ser. No. 09/023,170, filed Feb. 13, 1998, entitled MEMORY SYSTEM INCLUDING A MEMORY MODULE HAVING A MEMORY MODULE CONTROLLER by Thomas J. Holman. The Feb. 13, 1998 Holman application is incorporated herein by reference.

FIELD OF THE INVENTION

This present invention relates generally to digital memory devices and systems, and more particularly to memory module architectures and methods for operating such devices and systems.

BACKGROUND OF THE INVENTION

Microprocessors, digital signal processors, video devices, and many other types of digital data processing devices rely on an attached high-speed memory system to hold data and/or processor instructions needed by the processing device. As these processing devices become faster and more powerful, the increased demands placed on them generally translates to a need for larger and faster attached memory systems.

Figure 1:
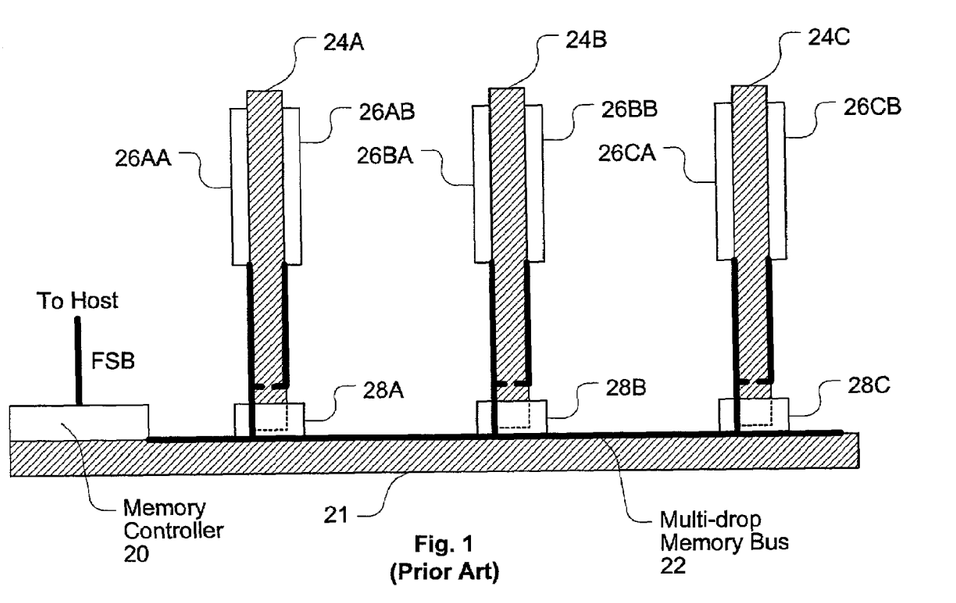
FIG. 1 illustrates an edge view of a prior art memory system.

FIG. 1 depicts a typical memory system configuration. One or more memory devices 26AA, 26AB, 26BA, 26BB, 26CA, and 26CB interface with a memory controller 20 through memory bus 22. A host (e.g., a central processing unit (CPU), not shown) also connects to memory controller 20 through a front-side bus FSB. The memory devices hold data in arrays of addressable memory cells. Memory controller 20 controls the exchange of data between the host and the memory storage devices.

Memory bus 22 carries memory signals on a collection of signal lines. Memory signals fall generally into one of several categories including clock and control signals, address signals, command signals, and data signals. Data signals carry the actual data that will be stored in, or retrieved from, a memory device. Address signals specify the location within a memory device where data is to be read from or written to, and may also select which of several memory devices is to be accessed. Command signals instruct a memory device as to what type of operation is to be performed, e.g., read, write, refresh, and possibly as to which of several access modes (such as a burst mode) should be used for a data transfer. Clock and control signals synchronize the other signals passing between controller 20 and the memory devices. Although memory bus 22 may use a separate signal line for each memory signal (e.g., 32 address lines to transfer a 32-bit-wide address in one clock cycle and 32 data lines to transfer a 32-bit-wide data word in one clock cycle), various schemes also exist to re-use one or more signal lines for different memory signals during different clock cycles of a memory transaction.

In the configuration shown in FIG. 1, memory bus 22 is a multi-drop memory bus. In other words, bus 22 is arranged with a backbone of signal lines. A signal line stub, or "drop", connects each of the memory devices (e.g., 26A) to the backbone. Typically, memory bus 22 will comprise a collection of leads routed on a printed circuit board 21 known as the "main board" or "motherboard". Memory controller 20 mounts to motherboard 21 and connects to one end of the leads comprising memory bus 22. Each drop of memory bus 22 connects to an electrical terminator, or socket. A typical main board contains multiple memory sockets, e.g., the three sockets 28A, 28B, and 28C shown in FIG. 1.

Memory is added to the memory system by inserting memory modules (e.g., 24A, 24B, 24C) into one or more of the sockets. One popular type of memory module is a Dual In-line Memory Module, or DIMM. The DIMM is a rectangular low-profile circuit board that has electrical contact points arranged on both sides along one long edge. The contact points form electrical connections to the main board's memory bus when the DIMM is inserted into a DIMM memory socket.

A DIMM generally has multiple individual memory devices mounted to it. The devices all work in parallel to perform memory functions. For instance, a DIMM may have eight memory devices, each of which receives the same memory address from the controller. If the size of a data word is 32 bits, each of the memory devices is responsible for four bits of the data word that is placed on the memory bus.

Figure 2:
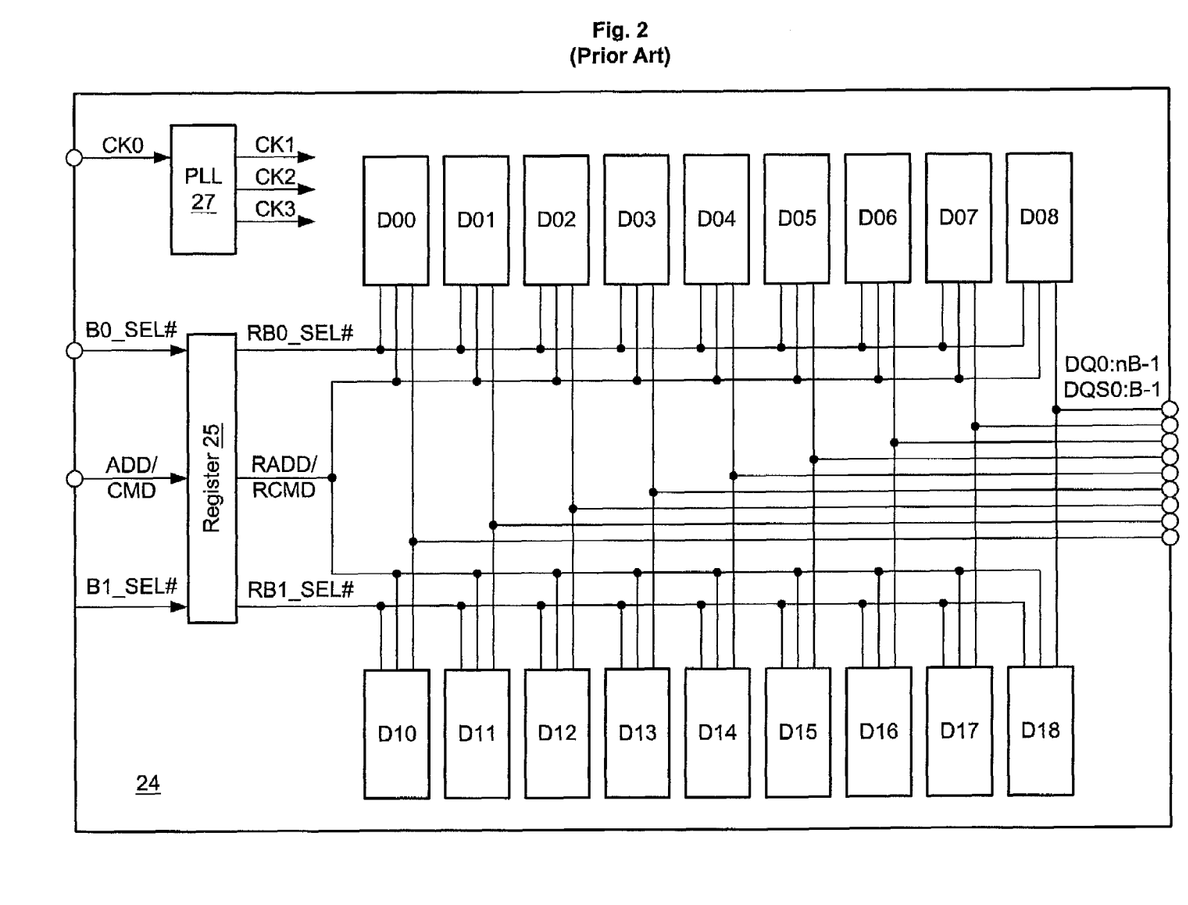
FIG. 2 contains a block diagram a prior art registered DIMM.

Some DIMM designs (like the design shown in FIG. 1) have more than one bank of memory devices. For example, FIG. 2 shows a block diagram of a registered DIMM 24 containing eighteen memory devices arranged in two banks, one bank containing devices D00–D08 and the other containing devices D10–D18. In a registered DIMM, the system clock CK0 is received by phase-locked-loop (PLL) 27, which creates a set of module clock signals. Address and command signals ADD/CMD are latched into a register 25 at the edge of one clock cycle, and then redriven onto the module addressing/command bus as register signals RADD/RCMD on the following clock cycle. Note that two bank select signals, B0_SEL# and B1_SEL#, each pass through register 25 and connect to a chip select pin on a corresponding one of the banks of memory devices. The data lines DQ of the memory device banks each connect to the memory bus of the host system. A total of nB DQ lines carry data signals, where B is the number of devices in one bank (e.g., eight or nine), and n is the data width of each device (e.g., four, eight, or sixteen bits). In addition, B DQS lines carry data strobes (one per device). The DQS data strobes travel with the data signals, and can be used for source-synchronous clocking of the data signals at the receiver.

Figure 3:
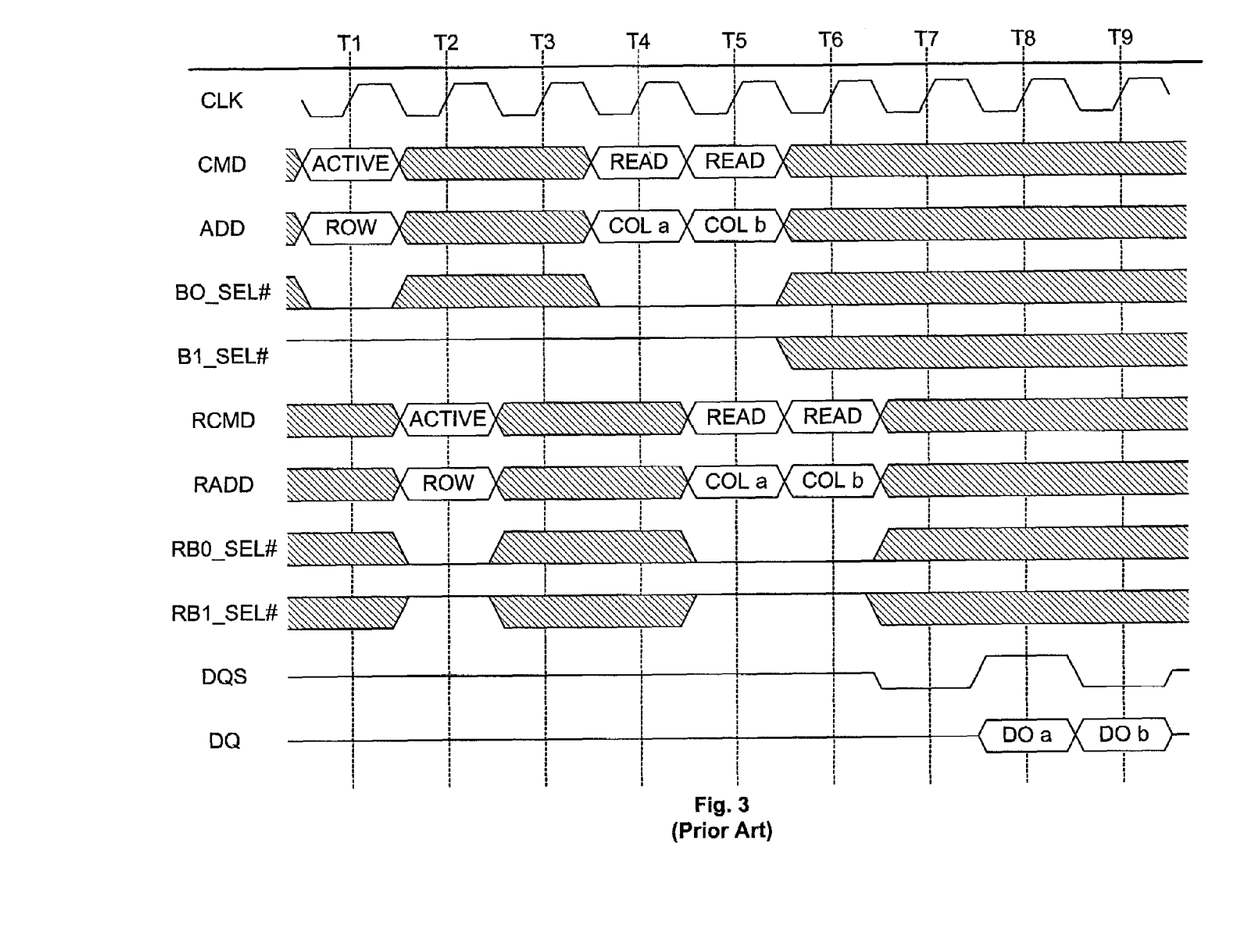
FIG. 3 shows a timing diagram for two consecutive read operations for the registered DIMM of FIG. 2.

FIG. 3 shows a timing diagram for two consecutive random reads to memory bank D00–D08. At T1, the memory controller transmits an ACTIVE command along with a ROW address, and takes B0_SEL# low to select bank 0 on module 24. Register 25 latches these signals, and places them on the module bus at T2. After a known RAS (row address strobe) latency, the controller transmits a READ command along with a COL "a" address. These signals also pass through register 25 with a one-clock cycle delay. After a known CAS (column address strobe) latency, the memory bank places data (DO a) from ROW and COL "a" onto bus lines DQ, and DQS is driven as well. Note that a read to a COL "b" can immediately follow the first read, as the columns are on the same ROW.

BRIEF DESCRIPTION OF THE DRAWING

The invention may be best understood by reading the disclosure with reference to the drawing, wherein.

DETAILED DESCRIPTION OF THE EMBODIMENTS

The dual-bank registered DIMM design of FIG. 2 has at least one desirable characteristic when compared to a single-bank design—for a given memory capacity on each device and a fixed memory bus width, the dual-bank design allows the capacity of the DIMM to double. A dual-bank DIMM can generally be manufactured for less than twice the cost of a single-bank DIMM and is therefore cheaper than two single-bank DIMMs. Dual-bank DIMMs can also be desirable where the number of DIMM sockets on a motherboard is limited.

The present disclosure includes a group of buffered memory module architectures. Generally, the disclosed embodiments use a memory module interface circuit that, in essence, widens the data bus on the memory module as compared to the width of the system memory data bus, allowing a faster system memory data bus to operate at full speed with slower memory devices. Preferably, this characteristic of the module is transparent to the memory system and to the memory devices: to the memory system, it appears that the module comprises memory devices that operate at the full speed of the memory system data bus; to the memory devices, it appears that each is connected to a controller operating at a slower speed compatible with the devices. This allows for an embodiment that is compatible with an existing memory controller/bus and with existing memory devices.

The memory module configurations and access methods disclosed herein can improve on the dual-bank registered DIMM in several respects. For instance, one embodiment describes a DIMM that can, with the same type of devices, number of devices, and data signal pins as the dual-bank registered DIMM, provide twice the data rate of the registered DIMM. This configuration can also allow the memory devices to operate at voltage levels independent of the voltage levels of the memory system that the module is attached to. The exemplary embodiments also allow the memory devices to be isolated from the full capacitive loading effects of the system memory data bus. Further, the memory devices of the embodiments avoid arrangements of competing memory banks that load each other, as is the case with a dual-bank DIMM. Finally, with the disclosed embodiments there is less need for complex logic, within the memory devices themselves, in order to increase the bandwidth of the memory system.

It is recognized herein that the multi-drop memory bus architecture also has several characteristics that limit its expansion to greater numbers of memory devices and/or faster bus speeds. First, the stubbed bus architecture can create undesirable reflections on the signal lines at high frequency. Overall bus length can also cause timing problems that limit operational frequency, as at high frequency a significant skew will be observed between when a memory signal arrives at a closer device vs. when that signal arrives at a device further down the bus. The length of the bus and the number of device inputs also determine the capacitance that a memory device (or the controller) sees when it drives the bus—at higher frequencies, this capacitance may make it infeasible to drive signals reliably on the bus.

The memory systems and modules described herein generally improve upon the multi-drop memory bus architecture by isolating the memory devices on each module from the bus, while providing retiming at the interface circuit of each module. Some of the disclosed embodiments go even further, by adding a dual port buffer to the module data port of the interface circuit. The dual-port buffer allows a primary memory controller and the modules to be connected in a point-to-point architecture. In this architecture, each memory module communicates directly with only its two nearest neighbors. Memory signals are forwarded from module to module until they reach the controller or the module that they are addressed to.

Figure 4:
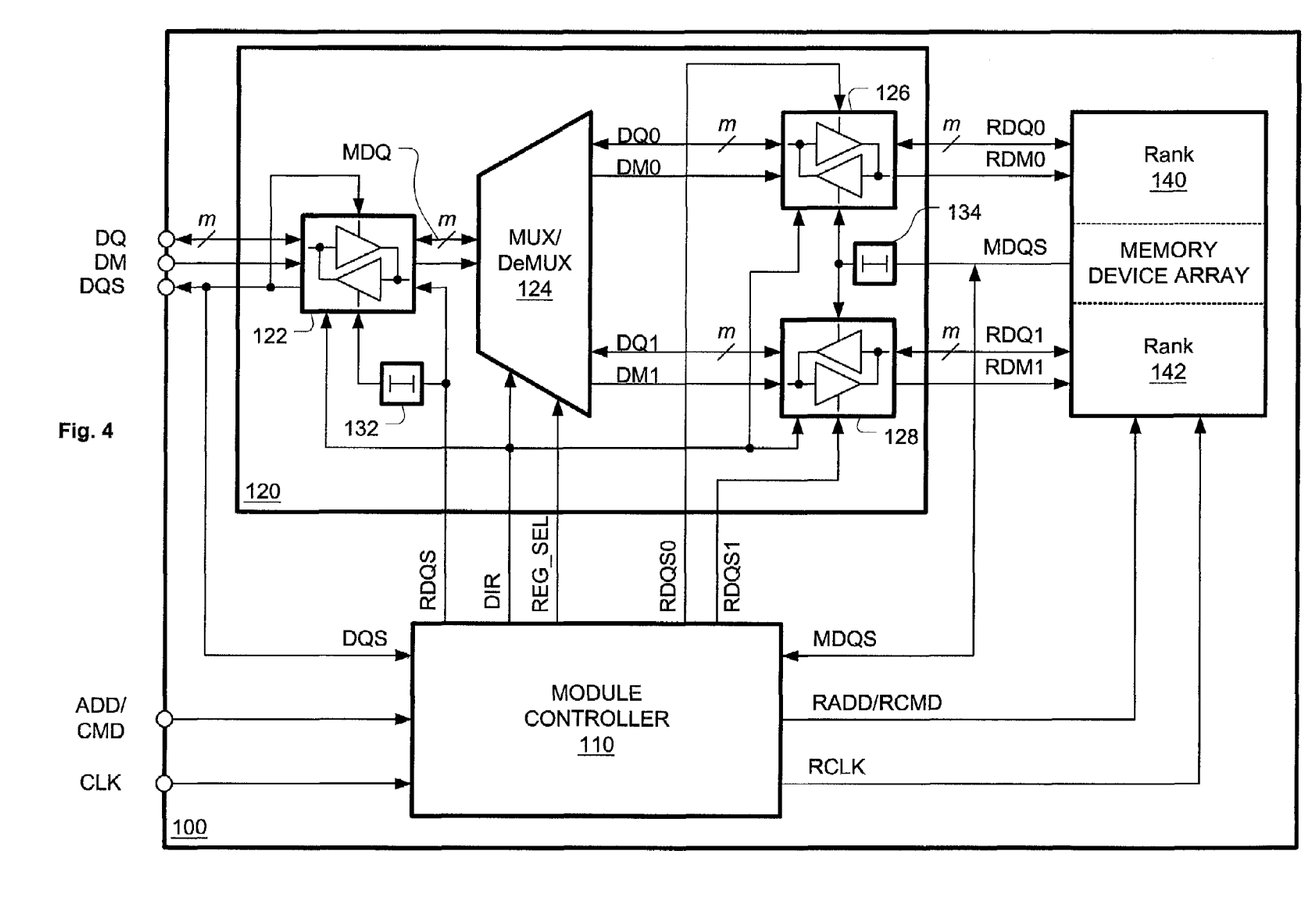
FIG. 4 shows a block diagram for a memory module according to one embodiment of the invention.

FIG. 4 illustrates a block diagram for one embodiment of a memory module 100. Memory module 100 contains three functional blocks; a module controller 110; a data interface circuit 120; and a memory device array 140/142.

The module controller 110 synchronizes the operation of module 100 with the attached memory system. Like the address/command registers and PLL of a registered DIMM, controller 110 can provide clock adjustment to an input CLK signal and registered versions of address and command signals, RADD/RCMD. In addition, module controller 110 provides timing and synchronization signals to data interface circuit 120. The function of the various timing and synchronization signals shown in FIG. 4 will be explained shortly.

Data interface circuit 120 provides for m-bit-wide data transfers between the module and the system memory data bus, and for R×m-bit-wide data transfers between the interface circuit and the memory device array. In FIG. 4, R=2, i.e., the memory device array comprises two memory device ranks 140 and 142, each capable of performing m-bit-wide data transfers. As used herein, a rank of memory comprises enough memory devices to form a data path that is m bits wide. Generally, multiple ranks will receive the same address and commands, and will perform memory operations with the interface circuit concurrently.

In FIG. 4, a bi-directional buffer 122 is coupled to a bi-directional module data port that can be connected to a system memory data bus. An m-bit-wide path through buffer 122 receives and drives data signals DQ on the system memory data bus. Optionally, a set of data mask bits DM can be accepted at the data port and redriven towards the memory array. The data mask bits allow the memory controller to selectively write a subset of an m-bit-wide set of data signals. For instance, with a 64-bit word size, an eight-bit mask DM can be used to specify that any combination of the eight bytes making up the word should not be written to memory. Finally, a data strobe signal DQS can be driven by buffer 122 onto the memory data bus.

Two bi-directional data registers 126 and 128 connect, respectively, to memory device array ranks 140 and 142. Each data register can receive an m-bit-wide word from its corresponding memory device rank, or drive an m-bit-wide word to that rank, over a dedicated point-to-point module data bus. When the optional data-masking signal feature is implemented, each data register can also drive a registered data-mask signal (e.g., RDM0 for register 126) to its corresponding rank when the register data is written to memory.

Multiplexer/demultiplexer (MUX/DeMUX) 124 has a multiplexing ratio R. In FIG. 4, either data signals DQ0 (from register 126) or data signals DQ1 (from register 128) can be multiplexed to buffer 122 when the module is reading from memory device array 140/142. Likewise, when the module is writing to the memory device array, data signals MDQ from buffer 122 can be channeled to either DQ0 or DQ1.

Module controller 110 synchronizes the operation of the data port buffer 122, MUX/DeMUX 124, and data registers 126 and 128 via a number of control signals. For instance, direction signal DIR specifies whether data flow is towards the memory array (TO) or away from the memory array (AWAY). Module controller 110 determines the current value for DIR by snooping CMD signals as they pass through controller 110. For instance, DIR can default to TO, and switch to AWAY when the command signals latched into RCMD indicate an impending READ operation. When DIR is set to TO, buffer 122 is configured as a receiver (viewed looking in to circuit 120), MUX/DeMUX 124 is configured as a DEMUX, and registers 126 and 128 are configured as drivers (viewed looking in to circuit 120). When DIR is set to AWAY, buffer 122 is configured as a driver, MUX/DeMUX 124 is configured as a MUX, and registers 126 and 128 are configured as receivers.

The register select signal REG_SEL, in the AWAY mode, determines whether DQ0 or DQ1 will be supplied to buffer 122. Data is serialized from the data registers onto the memory data bus by reading 2m bits into the data registers during one memory device read cycle, and then driving these bits, m at a time, through MUX 124. For instance, REG_SEL can first select, e.g., DQ0 during a first bus clock cycle, and then DQ1 during the following bus clock cycle. In the AWAY mode, register data strobe RDQS is functional. When RDQS transitions, buffer 122 latches data from MUX 124 and drives that data onto the memory data bus.

In the TO mode, REG_SEL determines which of registers 126 and 128 will receive DQ at each memory bus clock cycle (note that an alternative is to supply DQ to the inputs of both registers, and ignore REG_SEL). In the TO mode, register data strobes RDQS0 and RDQS1 are also functional. When RDQS0 transitions, register 126 latches data from DQ0 (and DM0). When RDQS1 transitions, register 128 latches data from DQ1 (and DM1). In one memory bus clock cycle, m bits are directed to register 126 by strobing RDQS0. In the following bus clock cycle, m bits are directed to register 128 by strobing RDQS1. Both register contents are then written to memory device array 140/142 during a single device write cycle. Controller 110 strobes the memory device array, using the memory data strobe MDQS, to signal the array to write data from buses RDQ0 and RDQ1.

Figure 5:
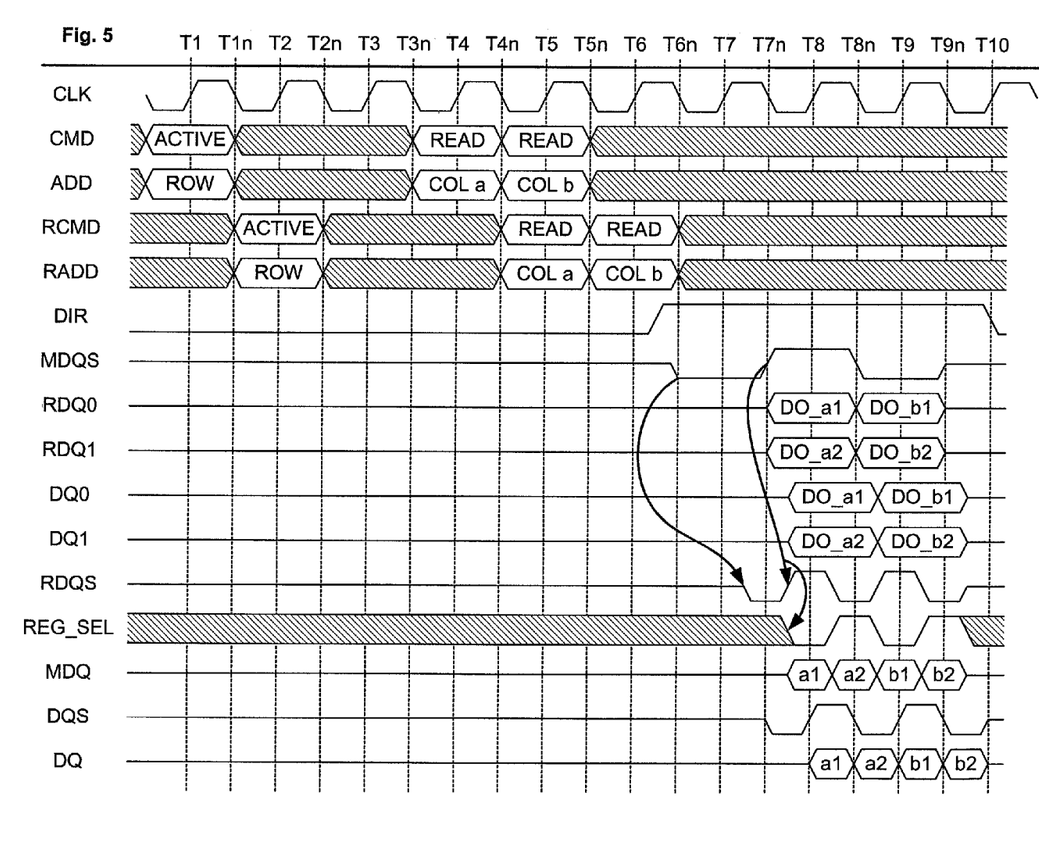
FIG. 5 shows a timing diagram for two consecutive read operations for the memory module of FIG. 4.

FIG. 5 illustrates a timing diagram for two consecutive read operations (to the same ROW of the memory devices) on module 100 of FIG. 4. Externally, a primary memory controller initiates READ operations just like it would for a registered DIMM (see the description accompanying FIG. 3). When controller 110 latches an active command into RCMD, it enters an ACTIVE state itself. In the ACTIVE state, controller 110 scans the command bus for READ or WRITE commands, as these commands signal that controller 110 will need to synchronize a data transfer. At T4, a READ command (to COL a) is clocked in, causing the controller to enter a READ state. At T5, a second READ command (to COL b) is clocked in; controller 110 counts the number of pending READ operations (including each operation's burst length if the devices support burst mode access) in order to track how long to stay in the READ state.

Controller 110 asserts DIR (where asserted equals AWAY) sometime after passing the first READ command to device array 140/142. This assertion time can vary, but preferably occurs prior to when device array 140/142 is expected to begin driving buses RDQ0 and RDQ1. Device array 140/142 signifies that it is about to drive data onto buses RDQ0 and RDQ1 by taking data strobe MDQS low at T6n. Note that typically, MDQS will comprise multiple strobes, each device in device array 140/142 supplying at least one strobe synchronized to its data signals. Module controller 110 senses the transition on MDQS—this causes module controller 110 to take register data strobe RDQS low in turn, thereby signaling to the primary memory controller that data transfer is about to occur.

At T7n, device array 140/142 takes MDQS high, signifying that data outputs "DO_a1" and "DO_a2" are being driven respectively onto buses RDQ0 and RDQ1 at that time. Delay element 134 delays MDQS long enough for the buses to settle, and then passes the MDQS strobe to registers 126 and 128. Upon receiving MDQS, registers 126 and 128 latch DO_a1 and DO_a2 (note that with multiple strobes coming from multiple devices, each strobe may be used to latch the data signals coming from its device). Note that DQ0 and DQ1 contain valid data shortly after the data first appears on RDQ0 and RDQ1.

Controller 110 also receives strobe MDQS. The positive transition of MDQS triggers two controller signals: a delayed (to correspond approximately with the appearance of valid data on DQ0 and DQ1) positive transition on strobe RDQS; and a corresponding negative transition on REG_SEL to steer DO_a1 to buffer 122. The multiplexer output trace MDQ shows that concurrent with the transition of REG_SEL, DO_a1 begins to stabilize at the input to buffer 122, and is stable before T8.

RDQS, along with the contents of DQ0, are latched into register 122 based on the transition of RDQS. A delay element 132 is used to ensure that RDQS has settled at the input of buffer 122 before it is latched. Shortly before T8, MDQ and RDQS are latched into buffer 122, and appear at the memory bus port as DQ and DQS shortly after T8.

Approximately a half-clock cycle after transitioning RDQS and REG_SEL, controller 110 transitions these signals again to place DO_a2 on the memory bus. While DO_a2 is being latched into buffer 122 (at T8n), the memory devices begin data output of the results of the second READ operation. The results of the second read operation propagate through the interface circuit in similar fashion to the results of the first read operation. The net result is that the memory data bus transfers 4m bits of data in two memory bus clock cycles (four m-bit transfers), with only two data accesses performed at each memory device on the module.

Figure 6:
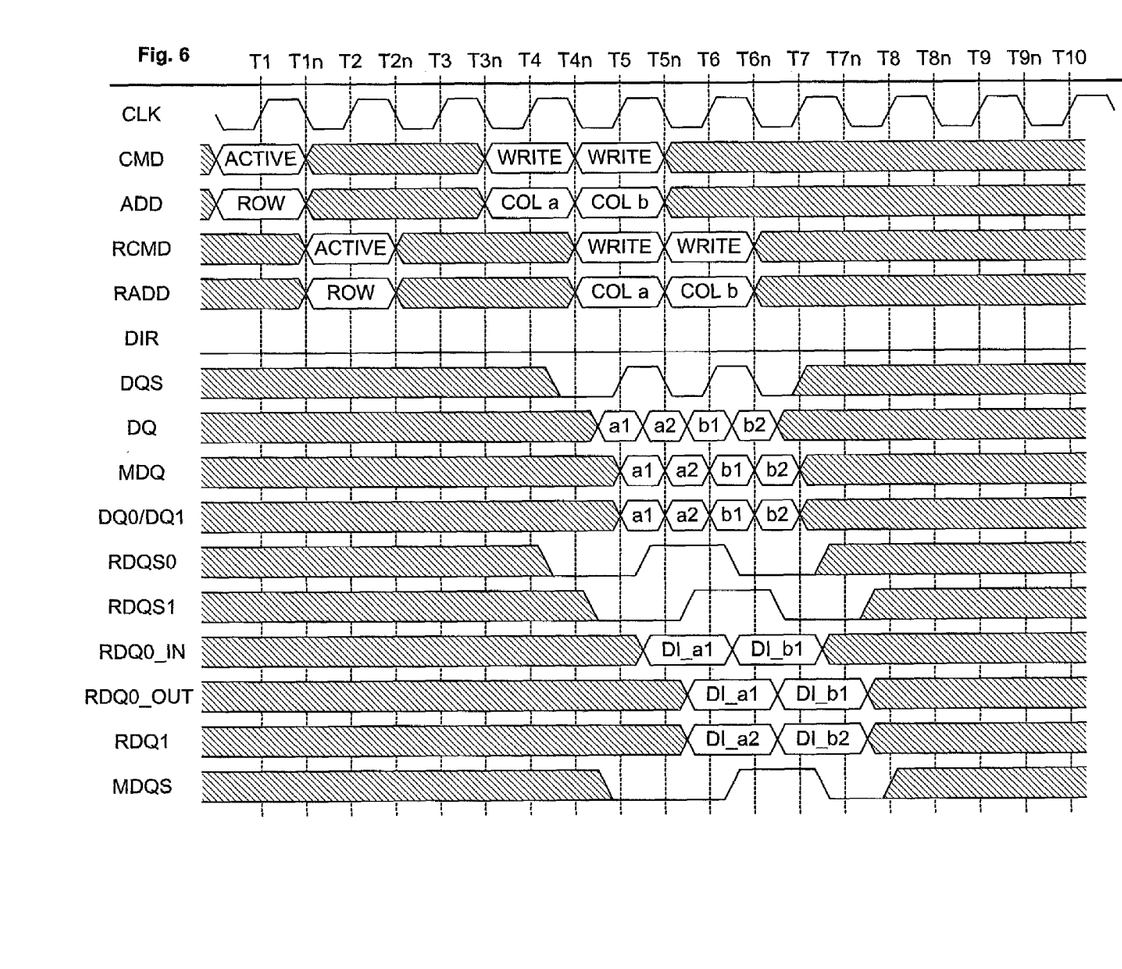
FIG. 6 shows a timing diagram for two consecutive write operations for the memory module of FIG. 4.

FIG. 6 shows an analogous timing diagram for two consecutive write operations. Like in the case above, module controller 110 enters an ACTIVE state upon latching the ACTIVE command from the primary memory controller. Upon sensing the first WRITE command, module controller 110 transitions to a WRITE state. This includes taking RDQS0 (and RDQS1, if desired) low in preparation for the first write operation.

DQS is center-aligned with the write data placed on DQ by the primary memory controller. Accordingly, DQS is used to clock DQ (and DM) into buffer 122 when DQS transitions at T5. Between T5 and T5n, DI_a1 is valid on MDQ, as well as on DQ0 and DQ1 (DeMUX 124 merely passes MDQ to the inputs of both data registers in this example).

Module controller 110 also receives DQS. After a delay to allow the inputs to register 126 to settle, module controller 110 transitions RDQS0 to latch DI_a1 into register 126.

At T5n, the primary memory controller transitions DQS again, causing buffer 122 to latch DI_a2. After a delay to allow the inputs to register 128 to settle, module controller 110 transitions RDQS1 to latch DI_a2 into register 128.

Note that in some embodiments, register 126 may have separate input and output stages—this allows register 126 to hold its output long enough to ensure that the memory device array receives it, while at the same time allowing register 126 to latch the next input from DQ. When such an arrangement is used, RDQS1 can be used as a transfer signal to cause register 126 to transfer the contents of its input stage to its output stage. In FIG. 6, this method of operation is illustrated by the two separate traces RDQ0_IN (input stage) and RDQ0_OUT (output stage).

Figure 7:
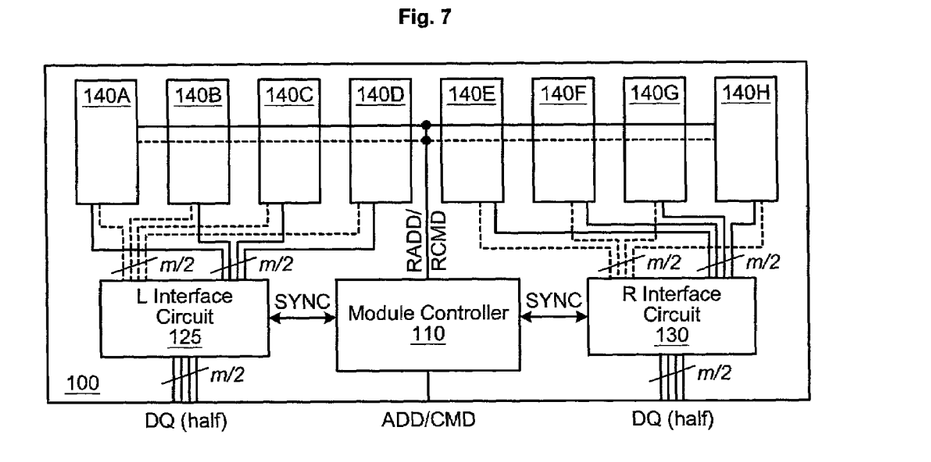
FIGS. 7 and 8 show, respectively, a side view for a general DIMM module layout for the memory module of FIG. 4, and a side edge view of multiple DIMM modules of this type connected to a multi-drop memory bus.

FIG. 7 shows the general component arrangement for a memory module 100 in a DIMM form factor. Two ranks of memory devices are arranged along the top of the DIMM card: memory devices 140A–140H are arranged on the facing side of the module, with memory devices 142A–142H arranged directly behind these (see the side view of module 100A in FIG. 8). Interface circuit 120 of FIG. 4 is split into two identical interface circuits (left circuit 125 and right circuit 130) in FIG. 7, each handling half of the data lines. This arrangement allows for more uniform lead lengths between an interface circuit and each of the memory devices, and reduces the pin count on each interface circuit package. In FIG. 7, the data signal lines for one memory rank are arranged on the front side of the card (solid lines leading to the memory devices), and the data signal lines for the other memory rank are arranged on the back side of the card (dashed lines leading to the memory devices). Module controller 110 is centered below the memory modules, equalizing signal distance to interface circuits 125 and 130. This arrangement also provides a more uniform path length for address and command signals RADD/RCMD. The signals labeled "SYNC" include the signals DQS, RDQS, DIR, REG_SEL, RDQS0, and RDQS1 shown in FIG. 4.

Figure 8:
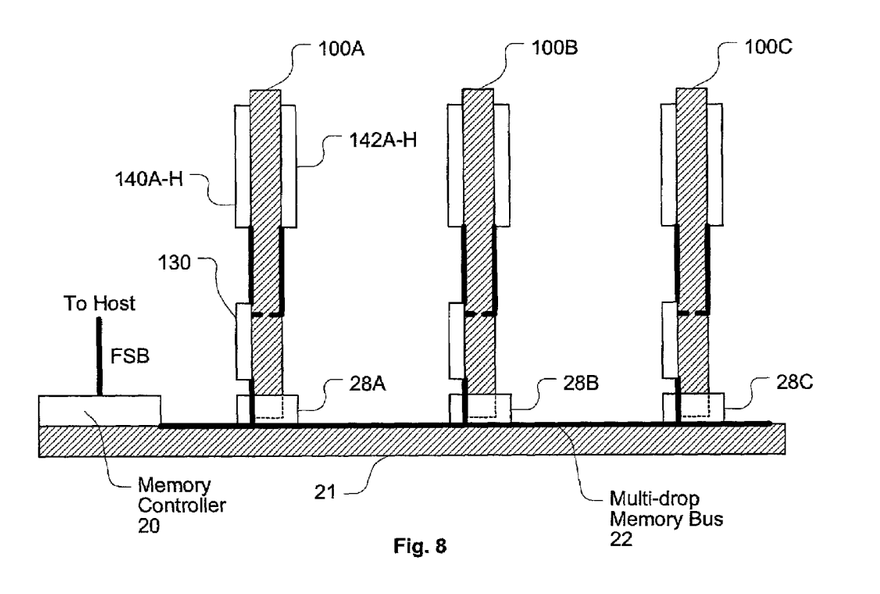

FIG. 8 shows three of the modules depicted in FIG. 7 arranged in a memory system with a primary memory controller 20 and a multi-drop memory bus 22. Note that with multiple modules, each module will recognize ACTIVE commands addressed to that module and respond accordingly; otherwise, the modules remain in a standby mode and need not pass commands through to their memory device arrays.

Figure 9:
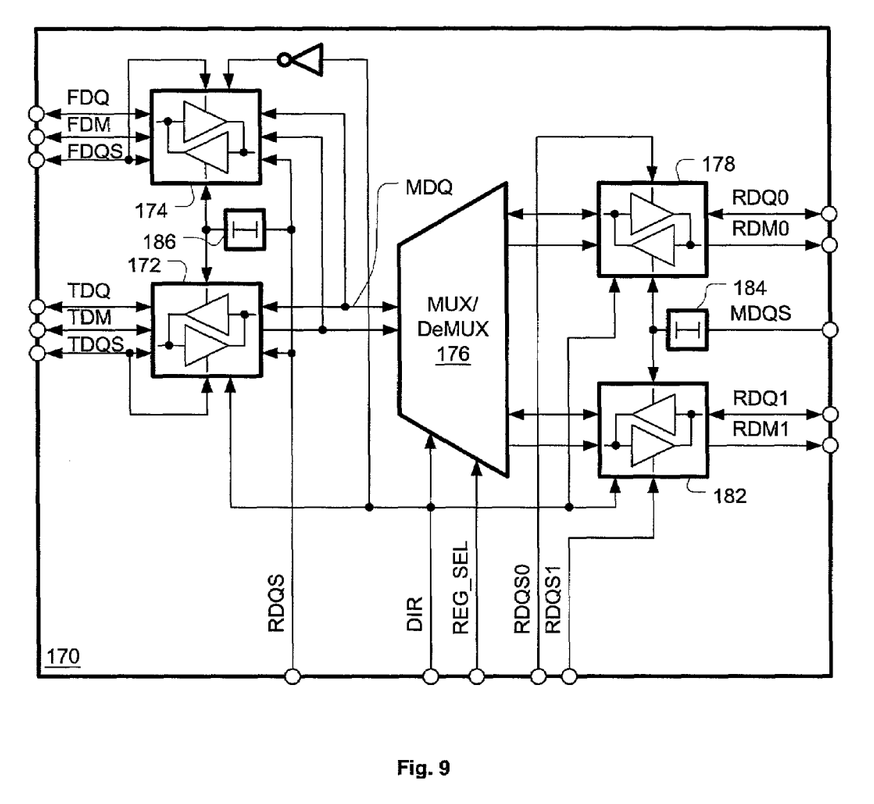
FIG. 9 shows a block diagram for a memory module interface circuit useful with another embodiment of the invention.

FIG. 9 illustrates an alternate interface circuit configuration 170 useful with a point-to-point memory data bus. Most of interface circuit directly corresponds to interface circuit 120 (MUX/DeMUX 176 and everything to the right of it). But the data port buffer in FIG. 9 is a dual-port data buffer, with a forwarding buffer 174 and a transfer buffer 172.

Communication between the primary memory controller and the interface take place at the transfer port, which comprises data signal lines TDQ, data masking signal lines TDM, and data signal strobe lines TDQS. A forwarding port comprises data signal lines FDQ, data masking signal lines FDM, and data signal strobe lines FDQS. The forwarding port allows for communication between the memory module and another memory module on an additional memory bus segment.

In operation, transfers between the memory module and the primary memory controller function similarly to those described for FIG. 4. But when a set of data signals is received at the forwarding port, those signals are clocked in and then clocked out on the transfer port during the next bus clock cycle. And when a set of data signals is received at the transfer port while the memory module is not ACTIVE, those signals are clocked in and then clocked out on the forwarding port during the next bus clock cycle.

Figure 10:
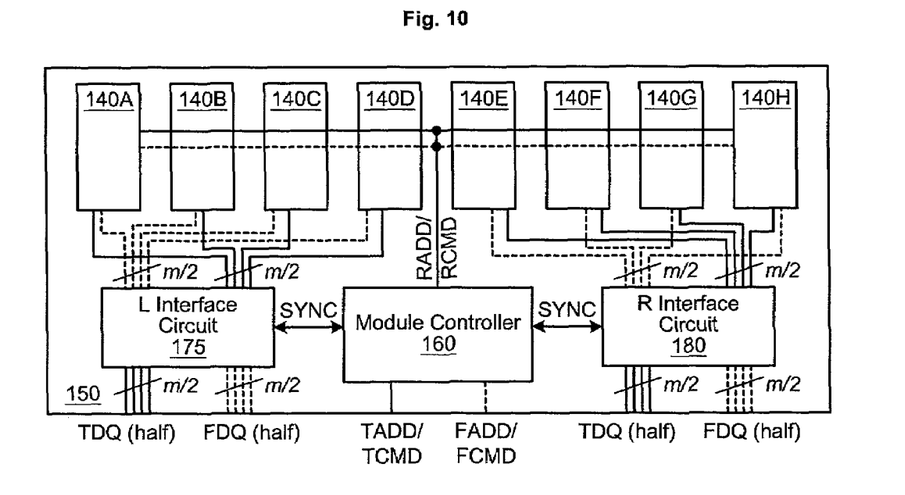
FIGS. 10 and 11 show, respectively, a side view for a general DIMM module layout for the memory module using the interface circuit of FIG. 9, and a side edge view of multiple DIMM modules of this type connected to a point-to-point virtual multi-drop memory bus.

FIG. 10 shows the general component arrangement for a memory module 150 arranged in a DIMM form factor and employing the interface circuit layout of interface circuit 170. The general arrangement of module 150 is similar to that of module 100 of FIG. 7, with interface circuit 170 split into two halves 175 and 180. The number of memory data bus connections along the card edge, however, has been doubled to facilitate support for a transfer port and a forwarding port. Note also that two address and command ports to module controller 160 are also shown—one port accepts transfer address and commands (TADD/TCMD) from an attached memory controller, and the other port transmits forwarded address and commands (FADD/FCMD) to other downstream modules.

Figure 11:
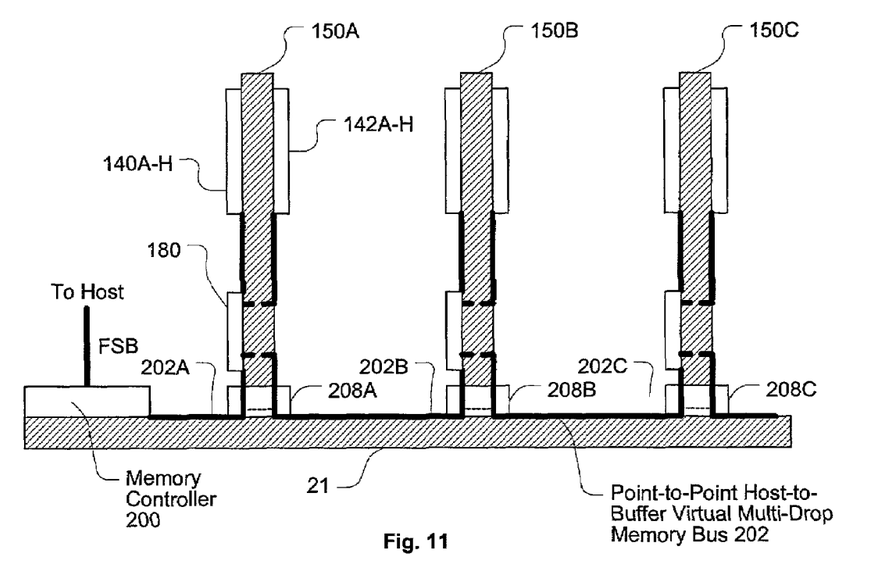

FIG. 11 shows three of the modules depicted in FIG. 10 arranged in a memory system with a primary memory controller 200 and a point-to-point memory bus 202. This memory bus is described as a "virtual multi-drop" bus because of its linear arrangement of modules—but the memory bus is actually made up of point-to-point data bus segments 202A, 202B, and 202C. Data bus segment 202A connects memory controller 200 to the transfer port of module 150A. Data bus segment 202B connects the forwarding port of module 150A to the transfer port of module 150B. And data bus segment 202C connects the forwarding port of module 150B to the transfer port of module 150C. In operation, module 150A, for instance, remains in a TRANSFER mode when it is not ACTIVE. In the transfer mode, module 150A merely picks up signals from either of its two ports and drives those signals to the other port.

Figure 12:
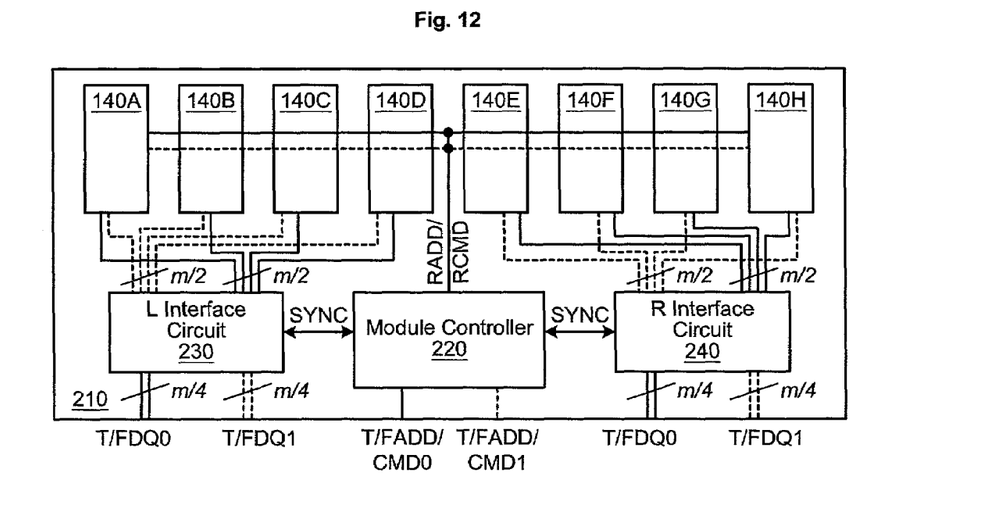
FIGS. 12 and 13 show, respectively, a side view for a general DIMM module layout using a variation of the interface circuit of FIG. 9, and a side edge view of multiple DIMM modules of this type connected to a point-to-point ring memory bus.
Figure 13:
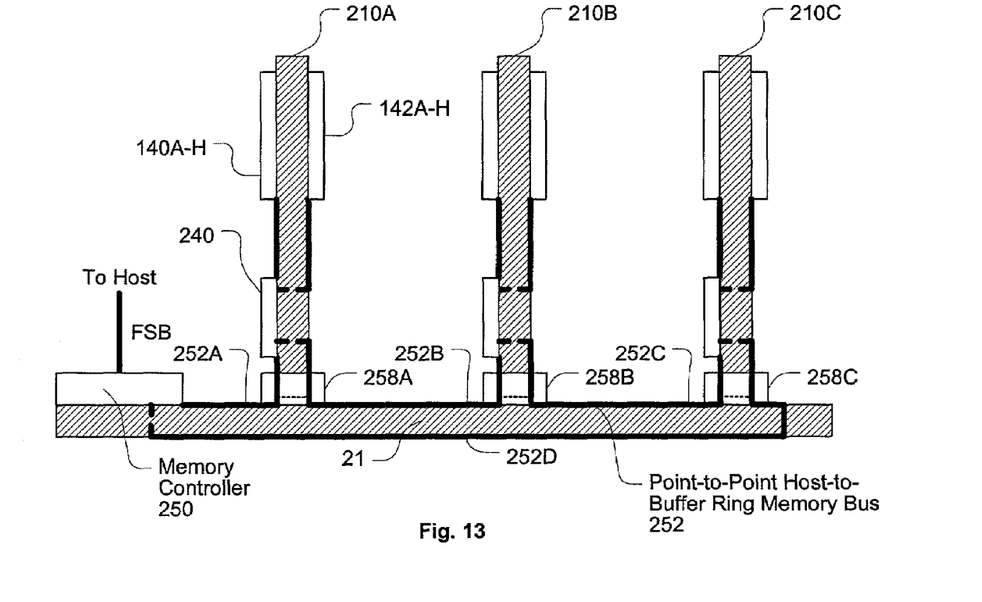

FIGS. 12 and 13 illustrate a variation on the point-to-point configuration of FIGS. 10 and 11. In FIG. 13, memory bus 252 is a ring memory bus. Like memory bus 202, memory bus 252 contains A, B, and C segments. But in addition, memory bus 252 contains a fourth segment 252D that connects the last module, 210C, back to the memory controller 250. When transfers occur on bus 252, half of the signals are sent in a clockwise direction and the other half are sent in a counter-clockwise direction. Like in the case above, modules that are not ACTIVE remain in a TRANSFER mode in which they propagate signals along the bus. But the ACTIVE module will receive data at both of its ports, and then must combine the data to form a full data word.

An advantage of the ring bus architecture is that is allows point-to-point bus connections without doubling the number of card pins. Referring to FIG. 12, each transfer/forwarding data port (e.g., port T/FDQ0) is only m/4 bits wide, whereas the ports in FIG. 10 were each m/2 bits wide. The ring bus architecture is one way in which an effective bit width can be different than the number of physical lines on any given memory bus segment.

An issue with the configuration of FIG. 12 is that data from two ports will need to be merged at some point. From FIG. 13, it can be seen that depending on which module is active, half of the data will take longer to reach the module than the other half. This can be compensated for in several ways. First, memory controller 250 can stagger transmission on segments 252A and 252D such that the two halves arrive at the destination module at approximately the same time. Second, the interface circuit can include a multistage buffer that delays the data input on one module port in order to align it with the data input on the other module port. And third, data from each of the two ports can be written separately to memory when it arrives by splitting each rank of memory in half and delaying the address and command signals to each half by an amount that compensates for the arrival delay of the data.

Many other variations on the illustrated embodiments are possible. For instance, although the illustrated examples use source-synchronous strobe signals to clock data, common-clock signaling can also be used in some embodiments and/or on some data paths of an embodiment. The illustrated examples also show two ranks of memory, but other numbers of ranks are also possible, e.g., a 4:1 multiplexer and four ranks of memory. The terms "buffer" and "register" have been used herein somewhat interchangeably—a register has a latching capability, whereas a buffer may have, but need not necessarily have, such a capability. Although bi-directional registers/buffers and a combination multiplexer/demultiplexer are illustrated, those skilled in the art recognize that an embodiment of the invention can also be constructed using two data paths with unidirectional components.

An embodiment can also have the capability to respond to a read that requests less than N=R×m bits by transferring less than N bits on the memory bus. For instance, consider a case where m=16 and R=4. If an allowable read operation requests only one 16-bit word, the module can respond by performing one 64-bit read internally to the four data registers. Then, only the one register of the four that contains the requested 16-bit word is multiplexed onto the memory data bus. This can be extended to read any number of m-bit words from one to R.

Likewise, an embodiment can also have the capability to respond to a write that requests to write less than N=R×m bits. Using the example above, if an allowable write operation requests to write only one 16-bit word, the masking bits on the other words can be set by the controller. The when a write to the ranks is performed, only the one word requested by the external memory controller will actually be written, and the other three words stored in the data registers will be ignored.

The types, sizes, or numbers of memory devices selected for use with the present invention are not critical. Some possible device types include dynamic random access memory (DRAM) devices, synchronous DRAM (SDRAM) devices including double-data-rate (DDR) SDRAM devices, quad-data-rate (QDR) SDRAM devices, Rambus™ DRAM devices (with an appropriate controller), static RAM and flash memory devices. It may be possible to combine memory modules in a memory system according to the invention where two modules incorporate different types of memory devices.

One of ordinary skill in the art will recognize that the concepts taught herein can be tailored to a particular application in many other advantageous ways. For instance, although the illustrated embodiments use one or two interface circuits and a separate module controller, all of these devices could be integrated in a single device, or in some other number of packages with some other division of the tasks to be performed by the module. The ranks need not be arranged on opposite sides of a card. Such minor modifications are encompassed within the invention, and are intended to fall within the scope of the claims. Although the specification may refer to "an", "one", "another", or "some" embodiment(s) in several locations, this does not necessarily mean that each such reference is to the same embodiment(s), or that the feature only applies to a single embodiment.

What is claimed is:

1. A memory system comprising:
   a primary memory controller;
   a point-to-point memory data bus, having an effective bit-width m, coupled to the primary memory controller;
   at least one memory module directly connected to the primary controller via a segment of the memory data bus, the memory module having a module data bus with an effective bit-width N=R×m, where R is an integer value greater than one, the memory module comprising an interface circuit coupled between the memory data bus and the module data bus, the interface circuit capable of performing m-bit-wide data transfers on the memory data bus, the interface circuit capable of performing N-bit-wide data transfers on the module data bus, said interface circuit comprising:
      R m-bit-wide data registers, each register capable of exchanging point-to-point data signaling with a corresponding rank of memory devices; and
      a multiplexer, having a multiplexing ratio R, coupled between the R data registers and the memory data bus; and
   one additional segment of the memory data bus for each additional memory module, the additional segment directly connecting the additional memory module to the module immediately preceding it.

2. The memory system of claim 1, wherein the memory data bus further comprising a ring data bus segment connecting the last of the memory modules in the memory system back to the primary memory controller.

3. The memory system of claim 1, wherein the memory data bus and the module data bus each having a clock rate, the memory data bus clocking at a rate R times the clock rate of the module data bus.

4. A memory module comprising:
   R ranks of memory devices, where R is at least two, each rank having an m-bit-wide data port;
   a module data port capable of exchanging data signaling over a memory data bus having an effective bit-width m;
   an interface circuit coupled between the module data port and the R memory-device-rank data ports, the interface circuit capable of performing m-bit-wide data transfers at the module data port, the interface circuit capable of performing R×m-bit-wide data transfers with the R ranks of memory devices, said interface circuit comprising:
      R m-bit-wide data registers, each register capable of exchanging point-to-point data signaling with a corresponding rank of memory devices through the data port of that rank; and
      a multiplexer, having a multiplexing ratio R, coupled between the R data registers and the external data port; and a controller capable of synchronizing the operation of the interface circuit and the memory device ranks such that a data transfer comprising R serial data transfers on the memory data bus can be completed internal to the memory module with one R×m-bit-wide data transfer with the memory device ranks.

5. The memory module of claim 4, wherein the controller supplies rank selection signals to the multiplexer and register latching signals to each of the data registers.

6. The memory module of claim 4, wherein data signaling between a data register and its rank of memory devices further comprises a bit mask received from the memory data bus along with a corresponding m bits, the multiplexer transferring the bit mask to the data register along with the corresponding m bits.

7. The memory module of claim 4, wherein the controller is capable of synchronizing the operation of the data registers, the module data port, and the multiplexer/demultiplexer in order to serialize data from a subset of the data registers onto the memory data bus.

8. The memory module of claim 4, wherein data transfers between one of the data registers and the corresponding rank of memory devices occurs at a clock rate related to the clock rate of the memory data bus by a factor 1/R.

9. The memory module of claim 4, where the module is a dual-inline memory module comprising a printed circuit board capable of connection to the memory data bus via insertion of the circuit board into a card edge connector connected to the memory data bus.

10. The memory module of claim 9, wherein R equals two, one of the two ranks of memory devices arranged on each side of the circuit board and connected to the corresponding data register via a set of module data signaling lines routed on the circuit board.

11. The memory module of claim 9, where the interface circuit comprises two interface circuits each serving half of the module data port and half of each rank of memory devices.

12. The memory module of claim 4, wherein the module data port comprises a dual-port buffer, each port of the dual-port buffer capable of connection to another memory module in a point-to-point configuration of memory data bus segments.

13. The memory module of claim 12, wherein each port is capable of connection to an m-bit-wide memory data bus segment, wherein one port comprises a transfer port and the other port comprises a forwarding port, the module capable of using the transfer port to transfer data signals between the interface circuit and a higher-level controller connected to the memory data bus, the module capable of using the forwarding port to connect to a second memory module in order to transfer data signals between the transfer port on the first memory module and the transfer port on the second memory module.

14. The memory module of claim 12, wherein each module data port is capable of connection to an m/2-bit-wide memory data bus segment, wherein the dual module data ports comprise first and second transfer/forwarding ports, the module capable of retransmitting data signals received at one of the transfer/forwarding ports, but not destined for that memory module, on the other transfer/forwarding port, the module also capable of transferring m/2 data signals between each of the transfer/forwarding ports and the interface circuit.

15. The memory module of claim 4, wherein data exchanges over the memory data bus comprise a data strobe signal, the module further comprising a data strobe circuit to generate data strobe signaling when transmitting data over the memory data bus.

16. The memory module of claim 15, wherein the controller begins an internal sequence of interface circuit write operations in response to an externally-supplied data strobe signal.

17. The memory module of claim 4, wherein data exchanges between the interface circuit and the ranks of memory devices comprise a data strobe signal, the module further comprising a data strobe circuit to generate data strobe signaling when transmitting data from the interface circuit to the ranks of memory devices, the interface circuit comprising a register circuit to latch data from the ranks of memory devices based on data strobe signaling received from those devices.

18. A method of host/memory communication comprising:
    initiating a data access transaction, involving N data bits, between a memory controller and a memory module;
    at the memory module, initiating a corresponding data access transaction between an interface circuit and R ranks of memory devices, each rank capable of m-bit-wide data transfers, R>1;
    transferring the N data bits between the memory controller and the memory module in m-bit-wide data segments;
    transferring the N data bits between the interface circuit and the R ranks of memory devices in M R×m-bit-wide segments, where $$M = \frac{N}{R \times m}$$

is an integer value; and
    initiating a valid data access transaction when N is an integer multiple of m, but less than R×m.

19. The method of claim 18, wherein N=R×m, such that for R data segments transferred between the memory controller and the memory module, one transfer occurs between the interface circuit and the memory devices.

20. The method of claim 18, further comprising clocking transfers between the memory controller and the memory module at R times the rate that transfers are clocked between the interface circuit and the memory devices.

21. The method of claim 18, wherein when the data access transaction is a write transaction, transferring the N data bits between the interface circuit and N/m of the ranks of memory devices, while signaling the remainder of the ranks to ignore the write transaction.

22. The method of claim 18, wherein when the data access transaction is a read transaction, transferring R×m data bits, including the N data bits requested for the read transaction, from the R ranks of memory devices to the interface circuit, and transferring the N data bits requested for the read transaction from the memory module to the memory controller.

23. A memory module comprising:
    R ranks of memory devices, where R is at least two, each rank having an m-bit-wide data port;
    a module data port capable of exchanging data signaling over a memory data bus having an effective bit-width m, the module data port comprising a dual-port buffer, each port of the dual-port buffer capable of connection to another memory module in a point-to-point configuration of memory data bus segments, each port capable of connection to an m-bit-wide memory data bus segment, wherein one port comprises a transfer port and the other port comprises a forwarding port, the module capable of using the transfer port to transfer data signals between the interface circuit and a higher-level controller connected to the memory data bus, the module also capable of using the forwarding port to connect to a second memory module in order to transfer data signals between the transfer port on the first memory module and the transfer port on the second memory module;

an interface circuit coupled between the module data port and the R memory-device-rank data ports, the interface circuit capable of performing m-bit-wide data transfers at the module data port, the interface circuit capable of performing R×m-bit-wide data transfers with die R ranks of memory devices; and a controller capable of synchronizing the operation of the interface circuit and the memory device ranks such that a data transfer comprising R serial data transfers on the memory data bus can be completed internal to the memory module with one R×m-bit-wide data transfer with the memory device ranks.

24. A memory module comprising:

R ranks of memory devices, where R is at least two, each rank having an m-bit-wide data port;

a module data port capable of exchanging data signaling over a memory data bus having an effective bit-width m, the module data port comprising a dual-port buffer, each port of the dual-port buffer capable of connection to another memory module in a point-to-point configuration of memory data bus segments, each module data port capable of connection to an m/2-bit-wide memory data bus segment, wherein the dual module data ports comprise first and second transfer/forwarding ports, the module capable of retransmitting data signals received at one of the transfer/forwarding ports, but not destined for that memory module, on the other transfer/forwarding port, the module also capable of transferring m/2 data signals between each, of the transfer/forwarding ports and the interface circuit;

an interface circuit coupled between the module data port and the R memory-device-rank data ports, the interface circuit capable of performing m-bit-wide data transfers at the module data port, the interface circuit capable of performing R×m-bit-wide data transfers with the R ranks of memory devices; and a controller capable of synchronizing the operation of the interface circuit and the memory device ranks such that a data transfer comprising R serial data transfers on the memory data bus can be completed internal to the memory module with one R×m-bit-wide data transfer with the memory device ranks.

* * * * *

UNITED STATES PATENT AND TRADEMARK OFFICE
CERTIFICATE OF CORRECTION

PATENT NO. : 7,024,518 B2 Page 1 of 1
APPLICATION NO. : 10/100312
DATED : April 4, 2006
INVENTOR(S) : Halbert et al.

It is certified that error appears in the above-identified patent and that said Letters Patent is hereby corrected as shown below:

At column 13, line 17, please replace "die" with --the--;

At column 14, line 13, please replace "each," with --each--.

Signed and Sealed this

Third Day of July, 2007

JON W. DUDAS
*Director of the United States Patent and Trademark Office*